United States Patent
Wada et al.

(10) Patent No.: US 9,084,386 B2
(45) Date of Patent: Jul. 14, 2015

(54) INSPECTION OF BALL GRID ARRAY SOLDERING WITH BOUNDARY DETECTION USING TOMOGRAPHIC ARTIFACT

(75) Inventors: Takahiko Wada, Tokyo (JP); Takuma Hirayama, Tokyo (JP)

(73) Assignee: SAKI CORPORATION, Tokyo (JP)

( * ) Notice: Subject to any disclaimer, the term of this patent is extended or adjusted under 35 U.S.C. 154(b) by 371 days.

(21) Appl. No.: 13/522,753

(22) PCT Filed: Mar. 30, 2010

(86) PCT No.: PCT/JP2010/002319
§ 371 (c)(1),
(2), (4) Date: Jul. 18, 2012

(87) PCT Pub. No.: WO2011/089657
PCT Pub. Date: Jul. 28, 2011

(65) Prior Publication Data
US 2012/0294508 A1 Nov. 22, 2012

(30) Foreign Application Priority Data
Jan. 19, 2010 (JP) ................................ 2010-009343

(51) Int. Cl.
*G06K 9/00* (2006.01)
*G01R 31/04* (2006.01)
*H05K 13/08* (2006.01)
(Continued)

(52) U.S. Cl.
CPC .............. *H05K 13/08* (2013.01); *G01R 31/048* (2013.01); *G06T 7/0004* (2013.01); *H05K 3/3436* (2013.01); *H05K 2203/163* (2013.01)

(58) Field of Classification Search
None
See application file for complete search history.

(56) References Cited

U.S. PATENT DOCUMENTS 5,592,562 A * 1/1997 Rooks ........................... 382/150
5,687,209 A * 11/1997 Adams ........................... 378/22
(Continued)

FOREIGN PATENT DOCUMENTS

JP         3657242 B2    3/2005
JP      2006-226875 A    8/2006
(Continued)

OTHER PUBLICATIONS

Office Action dated Feb. 4, 2014 for Japanese Patent Application No. 2010-009343 with English translation.
(Continued)

*Primary Examiner* — Barry Drennan
(74) *Attorney, Agent, or Firm* — Ladas & Parry LLP

(57) ABSTRACT

A substrate surface detection unit performs image analysis of cross-sectional images of an object to be inspected including a substrate and an electronic component and specifies a surface image on which the surface of the substrate is photographed. A pseudo cross-sectional image creation unit specifies a region of the solder for joining the substrate and the electronic component, the solder being photographed on the cross-sectional images, and creates a pseudo cross-sectional image in which an imaged region is made to have a thickness in a pseudo manner by piling up the cross-sectional images on which the solder is photographed. An inspection unit estimates whether the joint state of the solder is good or bad by performing image analysis on the region of the solder photographed on the surface image and the pseudo cross-sectional image.

2 Claims, 8 Drawing Sheets

(51) Int. Cl.
*G06T 7/00* (2006.01)
*H05K 3/34* (2006.01)

(56) References Cited

U.S. PATENT DOCUMENTS 6,665,433 B2 * 12/2003 Roder ............................ 382/147
7,013,038 B1 * 3/2006 Patnaik ......................... 382/145

FOREIGN PATENT DOCUMENTS

JP    2007-114150 A    5/2007
JP    2008-26334 A     2/2008

OTHER PUBLICATIONS

International Search Report dated Apr. 27, 2010 for Application No. PCT/JP2010/002319.
International Preliminary Report on Patentability dated Apr. 27, 2010 for Application No. PCT/JP2010/002319.
Patent Abstracts of Japan English abstract of JP 2006-226875 A.
Patent Abstracts of Japan English abstract of JP 2008-26334 A.
Patent Abstracts of Japan English abstract of JP 2003-344312 A.
Patent Abstracts of Japan English abstract of JP 2007-114150 A.

* cited by examiner

INSPECTION OF BALL GRID ARRAY SOLDERING WITH BOUNDARY DETECTION USING TOMOGRAPHIC ARTIFACT

RELATED APPLICATION INFORMATION

This application is a 371 of International Application PCT/JP2010/002319 filed 30 Mar. 2010 entitled "Inspection Device", which was published on 28 Jul. 2011, with International Publication Number WO 2011/089657 A1, and which claims priority from Japanese Patent Applications 2010-009343 filed 19 Jan. 2010, the content of which is incorporated herein by reference.

FIELD OF THE INVENTION

The present invention relates to an inspection apparatus of an object to be inspected, and in particular, to an inspection apparatus for inspecting an object to be inspected by using a transmission image of the object to be inspected obtained by radiating a radiation ray.

BACKGROUND ART

Examples of a substrate on which an electronic component is mounted (hereinafter, referred to as a "substrate") include a substrate on which a BGA (Ball Grid Array) is mounted and a substrate on which an LGA (Land Grid Array) is mounted. In these substrates, a terminal, which is an electrical connection portion of a component, is located between the substrate and the component, and it is difficult to observe, by a conventional visual inspection apparatus using a camera, the state of the solder for joining the component and the substrate. Accordingly, a technique is presented, in which the three-dimensional shape of the solder in a joint portion is reconstructed into an image based on transmission images of the solder obtained by radiating X-rays onto a substrate from multiple different directions such that the inspection is performed by using a cross-sectional image in which any cross-section of the solder has been cut out (see Patent Document 1).

PATENT DOCUMENT

[Patent Document 1] Japanese Patent Application Publication No. 2006-226875.

DISCLOSURE OF THE INVENTION

Problem to be Solved by the Invention

According to the technique in Patent Document 1, etc., the three-dimensional shape of the solder in a joint portion can be obtained as a plurality of tomographic images; however, it is necessary for an operator to determine, each time, the joint state between a substrate and the solder from these tomographic images, thereby possibly increasing inspection manhour.

The present invention has been made in view of these situations, and a purpose of the invention is to provide a radiation ray inspection apparatus by which an object to be inspected can be simply inspected.

Means for Solving the Problem

An embodiment of the present invention relates to an inspection apparatus. This apparatus comprises: a substrate surface detection unit configured to perform image analysis of cross-sectional images of an object to be inspected including a substrate and an electronic component and to specify, from the cross-sectional images, a surface image in which the surface of the substrate is photographed; a pseudo cross-sectional image creation unit configured to specify, based on the surface image, a region of the solder for joining the substrate and the electronic component, the solder being photographed on the cross-sectional images, and to create a pseudo cross-sectional image on which an imaged region is made to have a thickness in a pseudo manner by piling up the cross-sectional images on which the solder is photographed; and an inspection unit configured to estimate whether a joint state of the solder is good or bad by performing image analysis on the region of the solder photographed on the surface image and on the region of the solder photographed on the pseudo cross-sectional image.

It is noted that any combination of the aforementioned components or any manifestation of the present invention exchanged between methods, devices, systems computer programs, data structures, and recording media, and so forth, is also effective as an embodiment of the present invention.

Advantage of the Invention

According to the present invention, a radiation ray inspection apparatus can be provided, in which an object to be inspected can be simply inspected.

BEST MODE FOR CARRYING OUT THE INVENTION

Outline of an embodiment of the present invention will be described. In the embodiment, a joint state of solder on a substrate, which is to be inspected, is determined by performing image analysis of both cross-sectional images on which the joint state of the solder is photographed and a pseudo cross-sectional image in which the joint portion of the solder is made to have a thickness in a pseudo manner by piling up the cross-sectional images. The joint state of the solder includes presence or absence of a bridge between solders, a fusion state of solder, and presence or absence of a void in solder.

Figure 1:
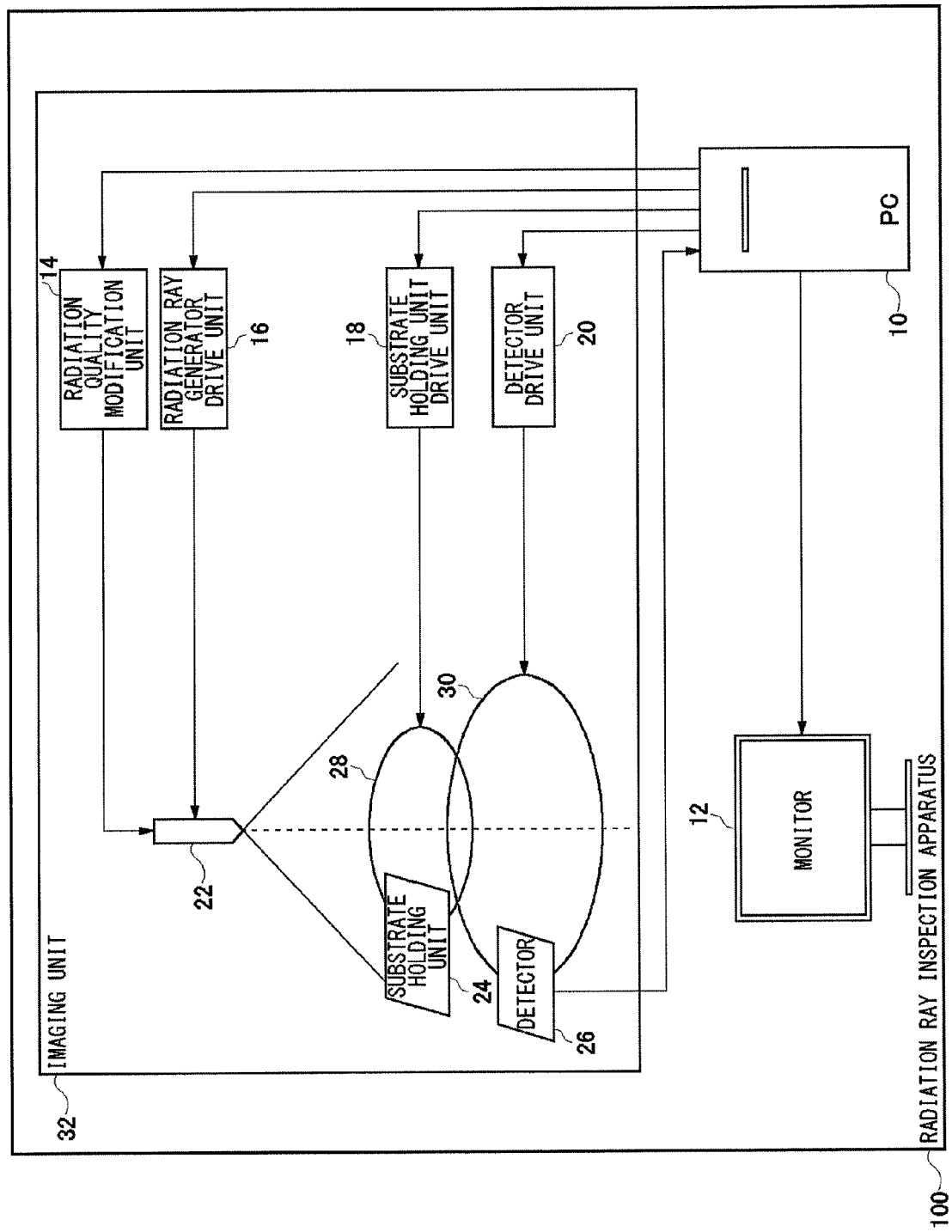
FIG. 1 is a view schematically illustrating the configuration of a radiation ray inspection apparatus according to the present invention.

FIG. 1 is a view schematically illustrating a radiation ray inspection apparatus 100 according to the embodiment. The radiation ray inspection apparatus 100 comprises a PC (Personal Computer) 10, a monitor 12, and an imaging unit 32. The imaging unit 32 further includes a radiation quality modification unit 14, a radiation ray generator drive unit 16, a substrate holding unit drive unit 18, a detector drive unit 20, a radiation ray generator 22, a substrate holding unit 24, and a detector 26.

The radiation ray generator 22 functions to generate a radiation ray, such as an X-ray, by, for example, making an accelerated electron hit a target, such as tungsten or diamond.

The substrate holding unit 24 holds a substrate, an object to be inspected. Radiation rays generated by the radiation ray generator 22 are radiated onto the substrate held by the substrate holding unit 24 such that the radiation rays passing through the substrate are photographed as an image by the detector 26. Hereinafter, a radiation ray transmission image of the substrate photographed by the detector 26 is referred to as a "transmission image".

The transmission image is sent to the PC 10 to be reconstructed into an image including a three-dimensional shape of solder in a joint portion by using a known technique, such as, for example, a Filtered-Backprojection (FBP) method. The reconstructed image or transmission image is stored in a storage in the PC 10 or in a non-illustrated external storage. Hereinafter, an image that has been reconstructed, based on transmission images, into a three-dimensional image including a three-dimensional shape of solder in a joint portion is referred to as a "reconstructed image". In addition, an image on which an arbitrary cross-section cut out from the reconstructed image is photographed is referred to as a "cross-sectional image". The reconstructed image and the cross-sectional image are outputted to the monitor 12. The monitor 12 displays results of inspecting a joint state of solder, which will de described later, in addition to the reconstructed image and the cross-sectional image.

The radiation quality modification unit 14 modifies the quality of the radiation ray generated by the radiation ray generator 22. The quality of a radiation ray is determined by a voltage to be applied for accelerating an electron that is made to hit a target (hereinafter, referred to as a "tube voltage") or a current by which the number of electrons is determined (hereinafter, referred to as a "tube current"). The radiation quality modification unit 14 functions to control these tube voltage and tube current. This control can be achieved by using a known technique, such as a transformer or a rectifier.

Herein, the quality of a radiation ray is determined by the luminance and hardness of a radiation ray (spectrum distribution of a radiation ray). As a tube current is made larger, the number of electrons that hit a target becomes larger, thereby increasing the number of photons of a generated radiation ray. As a result, the luminance of the radiation ray becomes large. Some of components, such as, for example, capacitors, have a larger thickness than that of other components, and hence it is needed to radiate a radiation ray having a large luminance for taking a transmission image of these components. In such a case, the luminance of a radiation ray is adjusted by adjusting a tube current. In addition, as a tube voltage is made larger, the energy of an electron that hits a target becomes larger, thereby increasing the energy (spectrum) of a generated radiation ray. As the energy of a radiation ray becomes larger, the penetrating power thereof at which the radiation ray passes through a substance generally becomes larger, thereby allowing the radiation ray to be more resistant to being absorbed in the substance. The contrast of a transmission image taken by using such a radiation ray becomes small. Accordingly, a tube voltage can be used for adjusting the contrast of a transmission image.

The radiation ray generator drive unit 16 has a non-illustrated drive mechanism, such as a motor, and hence the radiation ray generator 22 can be transferred up and down along an axis passing through the focus of the generator 22. Thereby, a radiation field can be changed by changing the distance between the radiation ray generator 22 and an object to be inspected that is held by the substrate holding unit 24, thereby allowing a magnification of a transmission image taken by the detector 26 to be changed.

The detector drive unit 20 also has a non-illustrated drive mechanism, such as a motor, and hence the detector 26 can be rotationally transferred along a detector rotational trajectory 30. The substrate holding unit drive unit 18 also has a non-illustrated drive mechanism, such as a motor, and hence the substrate holding unit 24 can be parallel transferred on the plane made by a substrate rotational trajectory 28. The substrate holding unit 24 is configured to be rotationally transferred on the substrate rotational trajectory 28 simultaneously as the detector 26 is rotationally transferred. Thereby, a transmission image can be taken while changing the relative positional relationship between a substrate held by the substrate holding unit 24 and the radiation ray generator 22.

Herein, the turning radius of each of the substrate rotational trajectory 28 and the detector rotational trajectory 30 is not fixed, but is configured to be freely changed. Thereby, the radiation angle of a radiation ray at which the radiation ray is radiated onto a component arranged on the substrate can be changed.

The PC 10 controls the whole operations of the aforementioned radiation ray inspection apparatus 100. Although not illustrated in the view, input devices, such as a key board and a mouse, are connected to the PC 10.

Figure 2:
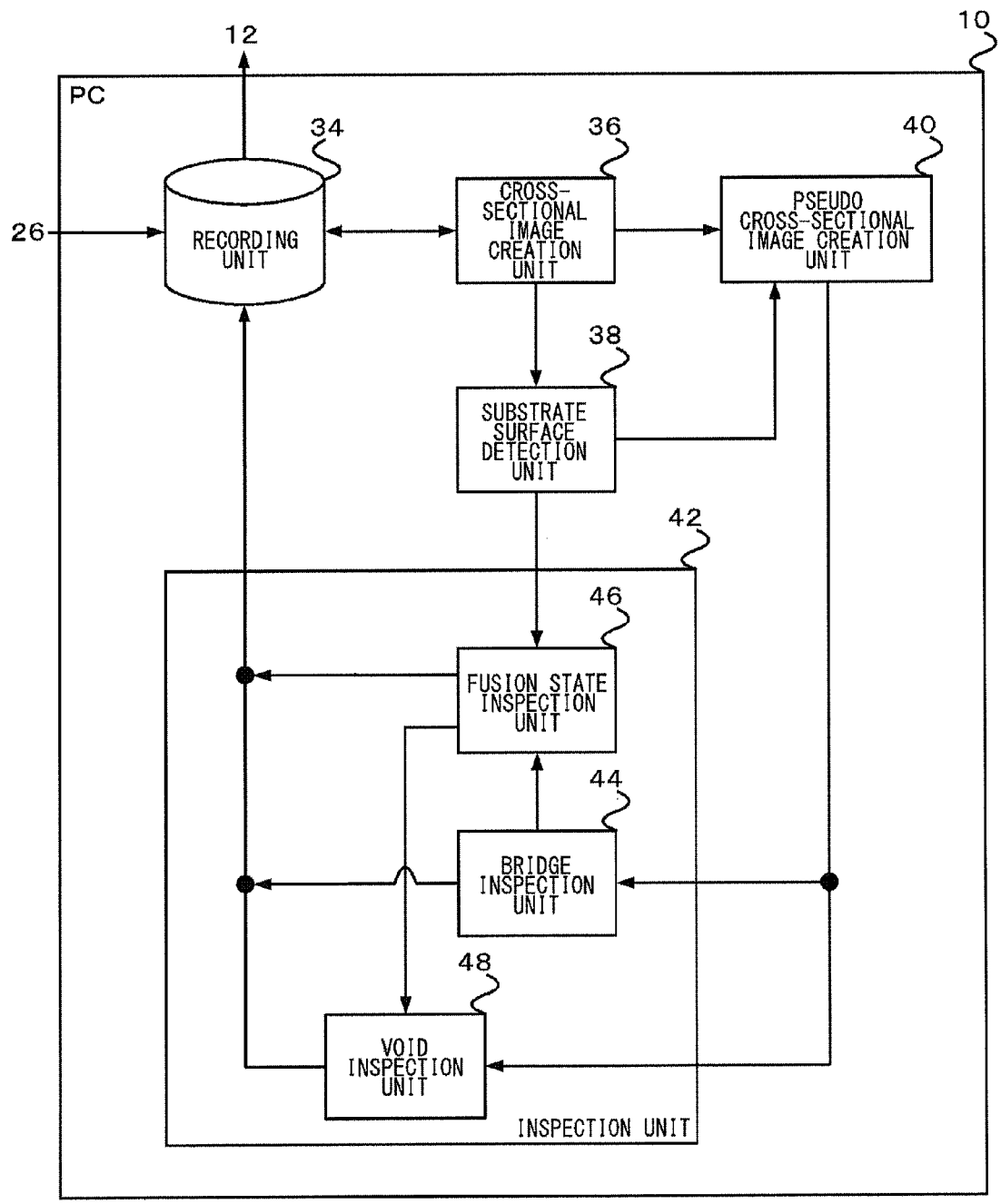
FIG. 2 is a view illustrating each of functional blocks by which the PC in FIG. 1 performs processing.

FIG. 2 illustrates each of functional blocks by which the PC 10 performs processing. The PC 10 includes a recording unit 34, a cross-sectional image creation unit 36, a substrate surface detection unit 38, a pseudo cross-sectional image creation unit 40, and an inspection unit 42. Although not illustrated, the PC 10 also includes an imaging control unit that controls the radiation quality modification unit 14, the radiation ray generator drive unit 16, the substrate holding unit drive unit 18, and the detector drive unit 20.

The recording unit 34 stores a transmission image of the substrate, a reconstructed cross-sectional image, and an inspection result by the later-described inspection unit 42, etc.

The cross-sectional image creation unit 36 creates a cross-sectional image based on multiple transmission images acquired from the recording unit 34. This can be achieved by using a known technique, such as, for example, the FBP method, a maximum likelihood estimation method, or the like. When a reconstruction algorithm is different, the quality of an acquired reconstructed image and a time necessary for the reconstruction are different. Accordingly, it may be configured that a user can select a reconstruction algorithm and a parameter used in the algorithm from multiple reconstruction algorithms and parameters prepared in advance. Thereby, a degree of freedom in the selection can be provided to a user, in which a user can place priority on making the time necessary for the reconstruction to be short or making image quality to be good even if a long time is needed. A created cross-sectional image is outputted to the recording unit 34 to be stored therein.

The substrate surface detection unit 38 specifies, from multiple cross-sectional images created by the cross-sectional image creation unit 36, a cross-sectional image on which the surface of the substrate is photographed. Hereinafter, a cross-sectional image on which the surface of the substrate is photographed is referred to as a "surface image". A method of detecting the surface image will be described in detail later.

The pseudo cross-sectional image creation unit 40 images a region of the substrate, the region having a larger thickness than that of the region photographed on a cross-sectional image, by piling up the predetermined number of serial cross-sectional images out of the cross-sectional images created by the cross-sectional image creation unit 36. The number of the cross-sectional images to be piled up is determined by both the thickness of the region of the substrate photographed on a cross-sectional image (hereinafter, referred to as a "slice thickness") and a slice thickness in a pseudo image. For example, if the height (e.g., 500 µm) of a BGA solder ball (hereinafter, simply referred to as "solder") is intended to be a slice thickness in a pseudo image when a slice thickness in a cross-sectional image is 50 µm, 500/50=10 cross-sectional images may be piled up. At the time, the surface images specified by the substrate surface detection unit 38 are used to specify the location of solder.

The inspection unit 42 inspects a joint state of solder based on the cross-sectional image created by the cross-sectional image creation unit 36, the surface image specified by the substrate surface detection unit 38, and the pseudo cross-sectional image created by the pseudo cross-sectional image creation unit 40. Because the solder for connecting the substrate and a component is located near to the surface of the solder, it can be determined, by inspecting both the surface image and a cross-sectional image on which a region near to the radiation ray generator 22 with respect to the surface image is photographed, whether the solder properly connects the solder and the component.

Herein, the "joint state of solder" means whether a substrate and a component are joined together by solder to create a proper conductive path. Inspections of a joint state of solder include a bridge inspection, a fusion state inspection, and a void inspection. The "bridge" means an undesired conductive path between conductors generated by the solders being joined together. The "fusion state" means a state as to whether the joint between a substrate and a component is insufficient due to lack of the fusion of solder, i.e., a state as to whether so-called "lifting" occurs. The "void" means a failure in a solder joint occurring due to a void in the solder joint. Accordingly, the inspection unit 42 includes a bridge inspection unit 44, a fusion state inspection unit 46, and a void inspection unit 48.

Although operations of the bridge inspection unit 44, the fusion state inspection unit 46, and the void inspection unit 48 will be described in detail later, the bridge inspection unit 44 and the void inspection unit 48 respectively inspect a bridge and a void based on the pseudo cross-sectional image created by the pseudo cross-sectional image creation unit 40; and the fusion state inspection unit 46 inspects a fusion state of solder based on the surface image specified by the substrate surface detection unit 38. The results of the inspection by the bridge inspection unit 44, the fusion state inspection unit 46, and the void inspection unit 48 are stored in the recording unit 34.

Each of the aforementioned functional blocks can be achieved by coordination of hardware, such as a CPU for executing various arithmetic processing and a RAM used as a work area for storing data or executing programs, and software. Accordingly, these functional blocks can be achieved in various forms by combinations of hardware and software.

Figure 3:
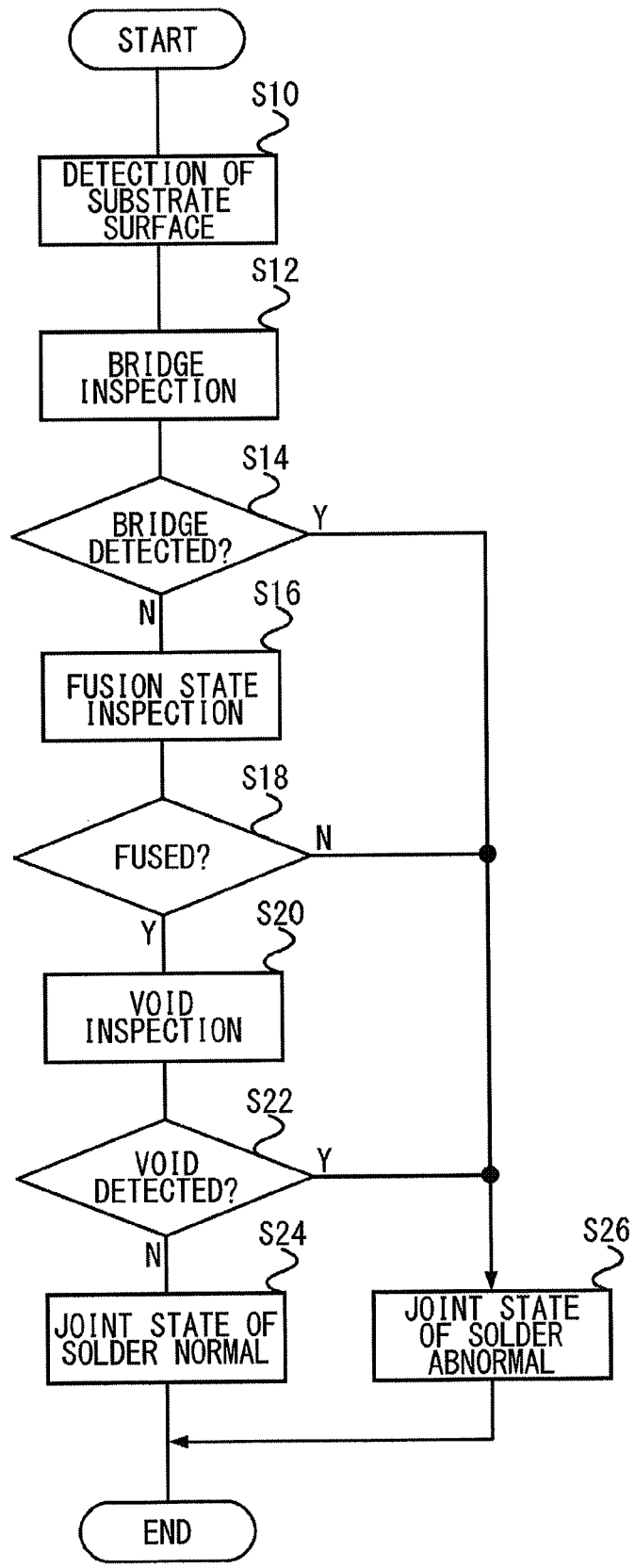
FIG. 3 is a flowchart explaining the flow of BGA inspection.

FIG. 3 is a flowchart illustrating the flow from the specification of a surface image to the inspection of a joint state of solder. The processing in the present flowchart is initiated when, for example, the cross-sectional image creation unit 36 creates a cross-sectional image.

The substrate surface detection unit 38 receives a cross-sectional image from the cross-sectional image creation unit 36 to specify a surface image therefrom (S10). The bridge inspection unit 44 acquires, from the pseudo cross-sectional image creation unit 40, a pseudo cross-sectional image whose slice thickness is almost the same as the thickness of a solder ball photographed on the pseudo cross-sectional image, to inspect presence or absence of a bridge (S12). When a bridge is not detected (S14N), the fusion state inspection unit 46 acquires a surface image from the substrate surface detection unit 38 to inspect whether the solder is fused (S16). When the solder is fused (S18Y), the void inspection unit 48 acquires, from the pseudo cross-sectional image creation unit 40, a pseudo cross-sectional image on which the solder ball is partially photographed to inspect whether a void is present (S20). When a void is not detected (S22N), the void inspection unit 48 determines that the joint state of the solder is normal (S24) and output that to the recording unit 34. When a bridge is detected (S14Y), when the solder is not fused (S18N), or when a void is present (S22Y), the bridge inspection unit 44, the fusion state inspection unit 46, and the void inspection unit 48 determine that the joint state of the solder is abnormal (S26) and output that to the recording unit 34, respectively. When the state of the solder is outputted to the recording unit 34, the processing in the flowchart is ended.

Figure 4:
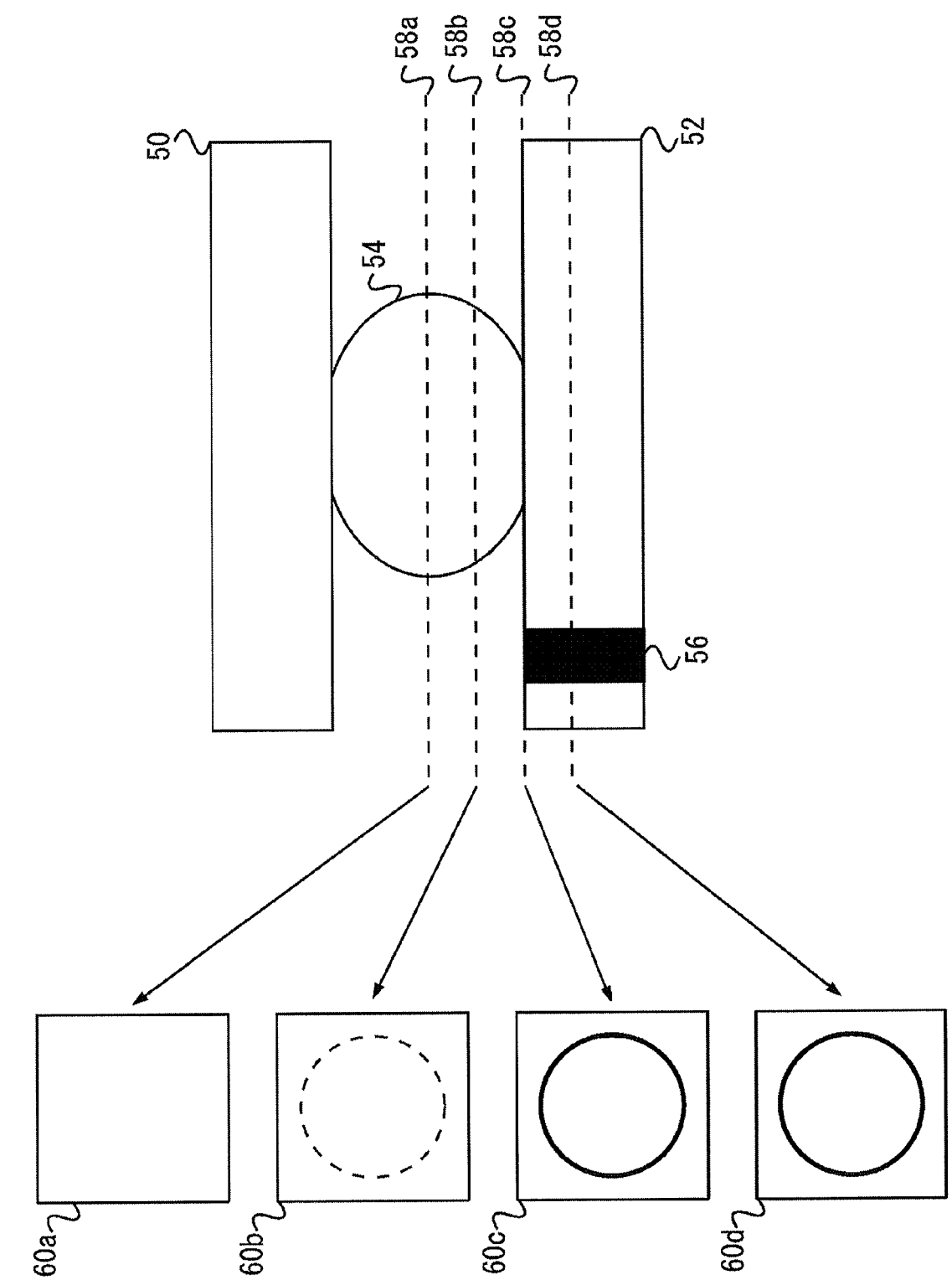
FIG. 4 is a view schematically illustrating, in a multilayer substrate, the relationship between a through-hole for connecting interlayer circuits and its cross-sectional image.

FIG. 4 is a view schematically illustrating, in a multilayer substrate, the relationship between a through-hole 56 for connecting interlayer circuits and their cross-sectional images, in which a principle for the substrate surface detection unit 38 detecting the surface of the substrate is explained. A state where a component 50 and a substrate 52 are joined by solder 54 is schematically illustrated in an enlarged manner.

Cross-sections of the through-hole 56 on a cross-section 58*d* passing through the inside of the substrate 52, on a cross-section 58*c* passing through the surface of the substrate, on a cross-section 58*b* passing through on the front side of the substrate, and on a cross-section 58*a* passing through almost the center of the solder 54, are illustrated as a fourth cross-sectional image 60*d*, a third cross-sectional image 60*c*, a second cross-sectional image 60*b*, and a first cross-sectional image 60*a*, respectively.

The substrate surface detection unit 38 sequentially calculates edge strengths of the through-hole 56 photographed on the fourth cross-sectional image 60*d* through the first cross-sectional image 60*a*. For the calculation of the edge strength, an outputted value from a known edge extraction filter, such as, for example, a Laplacian filter, may be used.

Although the through-hole 56 is not present on the cross-section 58*b*, the through-hole 56 is sometimes photographed on a cross-section near to the surface of the substrate because the resolution of a cross-sectional image is low in the direction perpendicular to the substrate. Therefore, the through-hole 56 can be photographed even on the second cross-sectional image 60*b*. However, when the edge strength of the through-hole 56 on each of the fourth cross-sectional image 60*a* and the third cross-sectional image 60*c* is compared with that of the through-hole 56 on the second cross-sectional image 60*b*, the former is remarkably larger than the latter. Accordingly, the substrate surface detection unit 38 sequentially calculates the edge strength of each of the through-holes 56 photographed on the fourth cross-sectional image 60*d* through the first cross-sectional image 60*a* and specifies, as a surface image, the cross-section immediately before the edge strength remarkably becomes small.

The substrate surface detection unit 38 can specify the surface of a substrate by the aforementioned method. When it is needed to further increase the accuracy in specifying the surface of a substrate, the substrate surface detection unit 38 can specify the surface of a substrate by detecting a land based on the cross-section specified as the surface of a substrate with the use of the edge strength of the through-hole 56. Herein, the "land" means a circular or quadrangular pattern present at the terminal end or in the middle of a conductor present on the surface of a substrate, such as a copper foil, alternatively means a pattern of a copper foil itself.

Because the thickness of the land is smaller than that of the through-hole 56, the contrast thereof is low in a cross-sectional image, which makes it difficult to detect the land. However, by making the surface of a substrate specified by the aforementioned method to be the starting point for the detection, it is ensured that the specified surface is a cross-section near to the surface of a substrate, thereby allowing the land to be detected at high accuracy. Because a land is present on the surface of a substrate, a cross-section on which a land has been detected can be determined as the surface of a substrate.

As described above, the substrate surface detection unit 38 according to the embodiment can specify the surface of a substrate based only on a cross-sectional image. Accordingly, the present method is more advantageous in terms of allowing an apparatus to be miniaturized and the cost thereof to be reduced, than the case where the surface of a substrate is specified by using information other than a cross-sectional image, such as a method of detecting the surface of a substrate by using laser. In particular, when an inspection apparatus is installed in a limited space in a production line, a large apparatus sometimes becomes an obstacle for the installation. Accordingly, miniaturization of an apparatus is very important. Further, the present method is more advantageous in terms of allowing maintenance cost to be suppressed, than the case where the surface of a substrate is detected by suing laser in which it is also needed to adjust an optical system.

Figure 5:
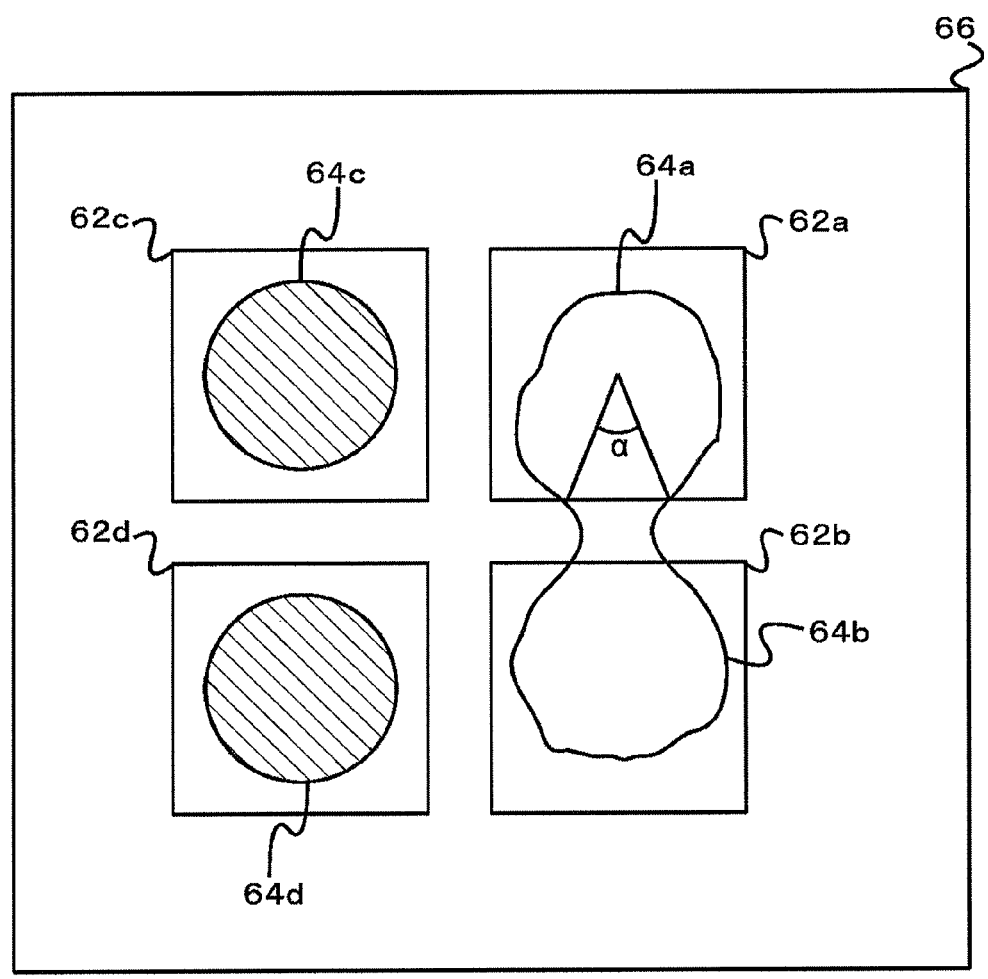
FIG. 5 is a view schematically illustrating part of a pseudo transmission image in which a slice thickness is set to include BGA solder.

FIG. 5 is a view schematically illustrating part of a pseudo transmission image 66 in which a slice thickness is set to include solder, in which a principle for the bridge inspection unit 44 detecting a bridge is explained.

A first window 62*a*, a second window 62*b*, a third window 62*c*, and a fourth window 62*d* are respectively inspection windows for inspecting bridges, and are set by an operator, etc., in advance. A first contour 64*a*, a second contour 64*b*, a third contour 64*c*, and a fourth contour 64*d* are contours of a BGA in a pseudo slice image, respectively. Each of the solders represented by the third contour 64*c* and the fourth contour 64*d* is normal in a solder state, and has an almost circular or ellipsoidal contour shape, and is located within each of the third window 62*c* and the fourth window 62*d*, which are respectively inspection windows for each of them.

An undesired conductive path, i.e., a bridge is generated between the solders represented by the first contour 64*a* and the second contour 64*b* by the two solders being joined together. When a bridge is generated, the contour of the solder is partially located outside an inspection window. In FIG. 5, the first contour 64*a* is partially located outside the first window 62*a*.

When a contour is partially located outside an inspection window, two intersections are generated between the contour and the inspection window. When the angle formed by viewing the two intersections from the center of the inspection window is represented by α, an amount of the contour of the solder, the contour being located outside the inspection window, can be estimated by a magnitude of α. Accordingly, the bridge inspection unit 44 calculates the angle α by acquiring, from the pseudo cross-sectional image creation unit 40, a pseudo cross-sectional image on which the solder is photographed, to determine that a bridge is generated when the angle α exceeds a predetermined angle. Herein, the "predetermined angle" means a reference angle for determining whether a bridge is generated. This angel may be determined in advance by experiments, and may be set to be, for example, approximately 5°. The predetermined angle can be larger than 0°, because a bridge is not necessarily generated even if a contour is partially located outside an inspection window.

When the bridge inspection unit 44 detects a bridge, it can be determined at the time that the joint state of solder is abnormal, and hence a fusion state inspection and a void inspection will be omitted. Thereby, a time necessary for performing these inspections can be saved.

Figure 6:
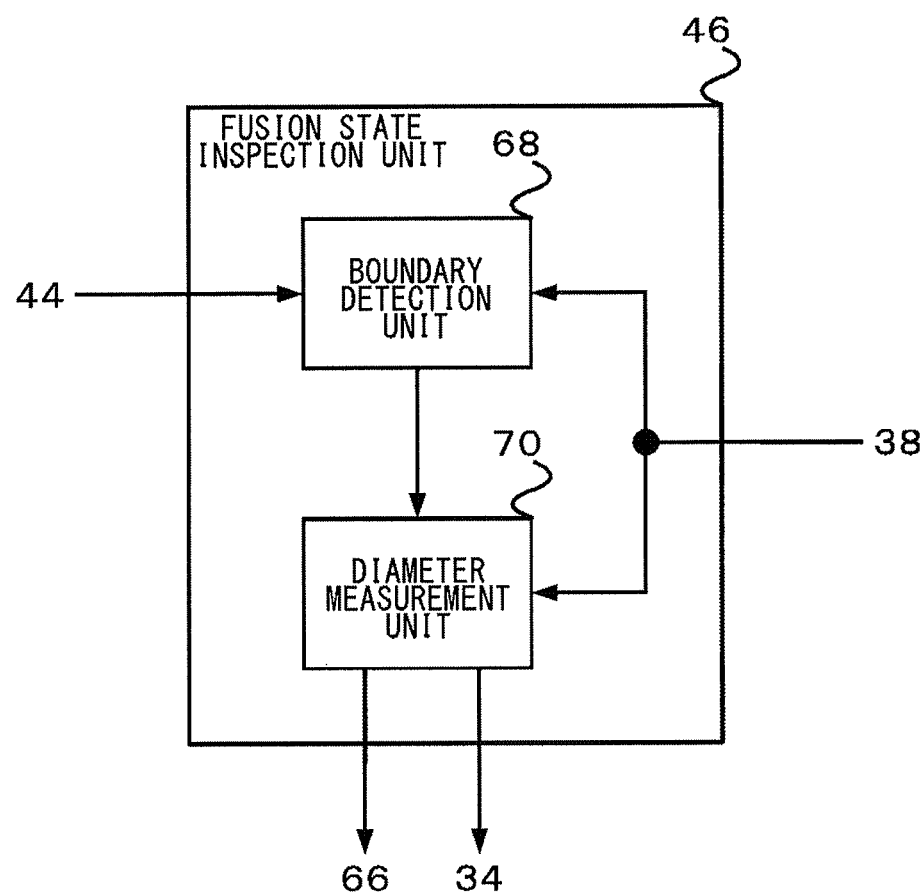
FIG. 6 is a view schematically illustrating the internal configuration of a fusion state inspection unit.

FIG. 6 is a view schematically illustrating the internal configuration of the fusion state inspection unit 46. The fusion state inspection unit 46 includes a boundary detection unit 68 and a diameter measurement unit 70.

Figure 7A:
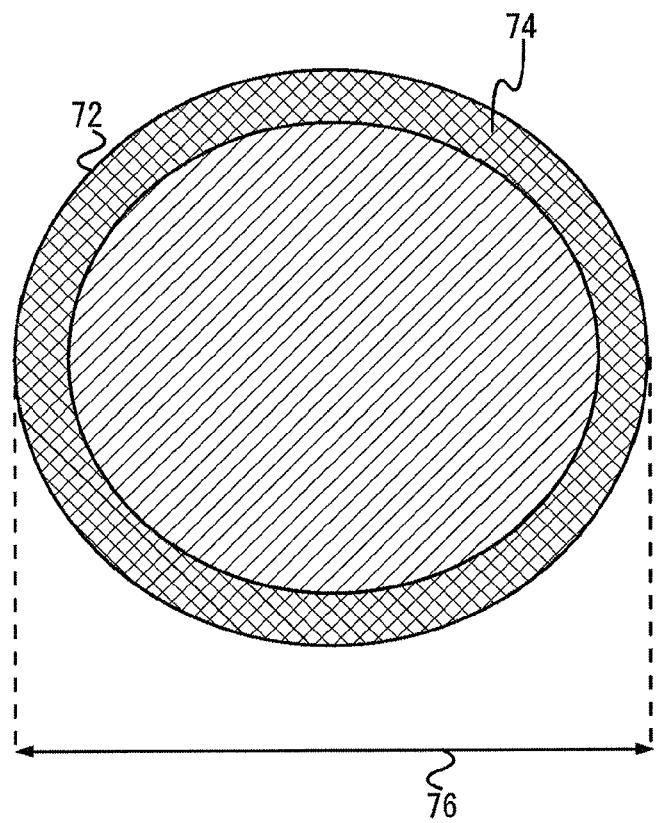
FIG. 7A is a view schematically illustrating a cross-sectional image of BGA on the surface of a substrate, when a fusion state of the solder is good and the substrate and a component are sufficiently joined by the solder.
Figure 7B:
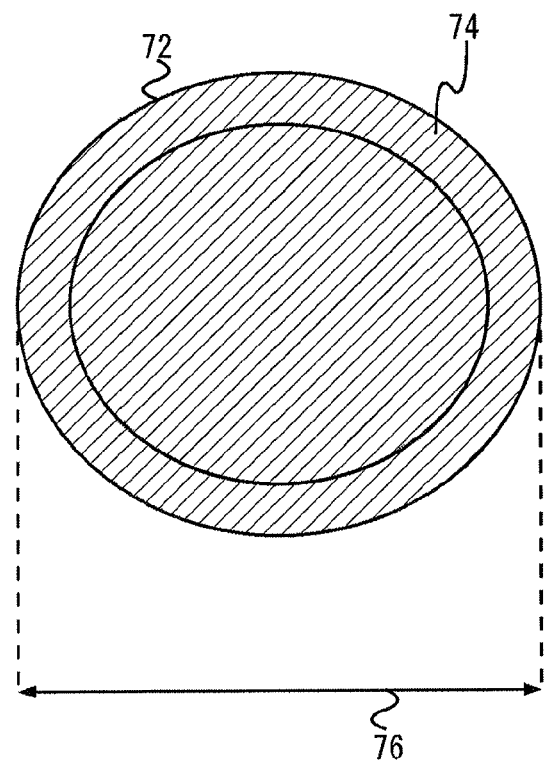
FIG. 7B is a view schematically illustrating a cross-sectional image of the BGA solder on the surface of the substrate, when the fusion state of the solder is bad and the substrate and the component are not sufficiently joined by the solder.

FIG. 7A is a view schematically illustrating solder 72 on the surface of a substrate, when a fusion state of the solder is good and the substrate and a component are sufficiently joined by the solder. FIG. 7B is a view schematically illustrating the solder 72 on the surface of a substrate, when the fusion state of the solder is bad and the substrate and the component are not sufficiently joined by the solder.

When the fusion state of solder is good, a difference in contrast is generated between the periphery of the surface and the inside of the solder 72, as illustrated in FIG. 7A. As a result, a ring-shaped edge 74 emerges in the boundary portion of the solder. On the other hand, when the fusion state of the solder is not good, a difference in contrast is hardly generated between the periphery of the surface and the inside of the solder 72, as illustrated in FIG. 7B, and the ring-shaped edge 74 is not generated so remarkably as when the fusion state of the solder is good. A main cause for which the ring-shaped edge 74 has been generated is an artifact generated because the number of the transmission images to be used for reconstructing a cross-sectional image is small. The ring-shaped edge 74 is a clue for estimating whether the fusion state of solder is good or bad.

Accordingly, the boundary detection unit 68 estimates, based on the ring-shaped edge 74, whether the fusion state of solder is good or bad. Specifically, the boundary detection unit tries generation of the ring-shaped edge 74 by performing edge extraction processing on the solder 72 on the surface of the substrate to link an edge having an edge strength larger than or equal to a predetermined magnitude. As a result, when the ring-shaped edge 74 whose length is, for example, larger than or equal to half the circumference is generated, it is determined that the fusion state of the solder is good. The predetermined edge strength and a degree of the link of the ring-shaped edge 74 for determining the fusion state of the solder, etc., may be experimentally determined in accordance with the state of a substrate or an imaging apparatus. Alternatively, it may be configured that the edge strength and the degree of the link, which have been once determined, are stored in the recording unit 34 to be used after read out therefrom.

Although the boundary detection unit 68 can estimate, by the aforementioned method, whether the fusion state of solder is good or bad, the unit 68 can also utilize the diameter 76 of the solder 72 on the surface of a solder in order to further increase the accuracy of the estimation.

When the solder 72 on the surface of a substrate in the case where the fusion state of the solder is good is compared with the solder 72 thereon in the case where the fusion state thereof is not good, the former is distributed in a wider area on the surface of the substrate that the latter. For example, when the fusion state of the solder is extremely bad, there can be the case where the solder is not present on the surface of the substrate. Accordingly, the diameter measurement unit 70 estimates, by measuring the diameter 76 of the solder 72 (when the solder 72 has an ellipsoidal shape, the long axis thereof), the fusion state of the solder 72 on the surface of a substrate is good or bad. When a component is determined, the size of a solder ball for the component is then determined, and hence an average diameter of the solder 72 on the surface of a substrate can be checked in advance. The diameter measurement unit compares the average diameter, measured as a reference, with the measured diameter 76. As a result, for example, when the measured diameter 76 is larger than or equal to the average diameter, the diameter measurement unit 70 determines that the fusion state of the solder is good.

Although the case where the distribution of the solder 72 on the surface of a substrate is estimated by using the diameter of the solder 72 has been described above, the diameter measurement unit 70 may use other information representing the distribution of the solder 72 on the surface of a substrate, such as an area.

When the boundary detection unit 68 and the diameter measurement unit 70 both determine that the fusion state of solder is good, the fusion state inspection unit determines that the fusion state of the solder is good. When the fusion state of solder is estimated from two different viewpoints including detection of the ring-shaped edge 74 and measurement of the diameter 76, as stated above, and when it is estimated that the fusion state thereof is good from each viewpoint, it is determined that the fusion state of the solder is good. Therefore, this method is advantageous in terms of less oversight of the case were the fusion state of the solder is not good. When the accuracy in the estimation performed by each of the boundary detection unit 68 and the diameter measurement unit 70 is sufficiently high, either of the two may only be used. In the case, a time necessary for the estimation can be saved, and hence it is advantageous in terms of increasing inspection efficiency as a whole.

When the fusion state inspection unit 46 determines that the fusion state of solder is bad, it can be determined at the time that the fusion state of the solder is abnormal, and hence a void inspection will be omitted. Thereby, a time necessary for the void inspection can be saved.

Figure 8:
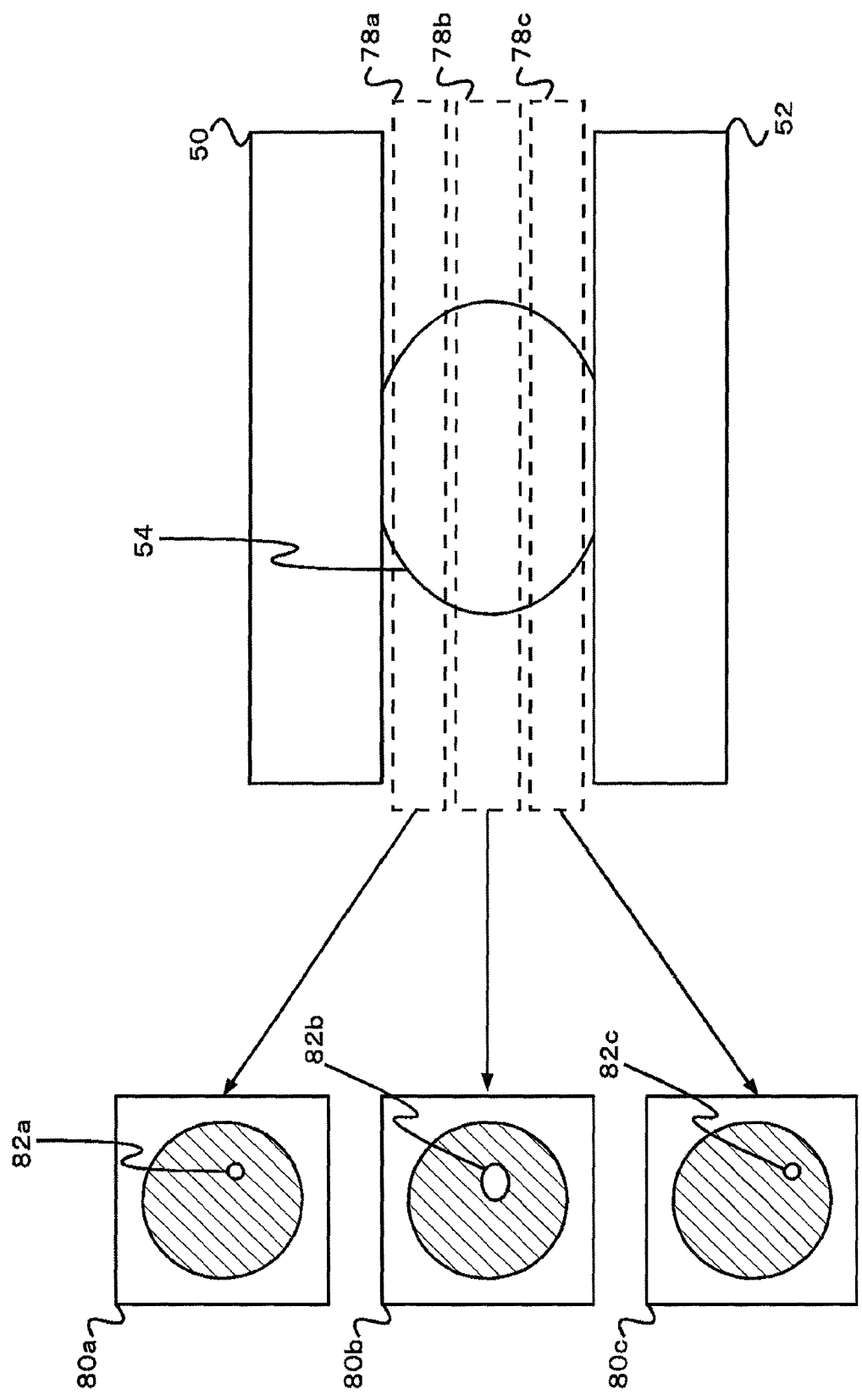
FIG. 8 is a view schematically illustrating both pseudo transmission images of the BGA solder for connecting the component and the substrate, and locations of their cross-sections.

FIG. 8 is a view schematically illustrating both pseudo transmission images of the solder 54 for connecting the component 50 and the substrate 52, and locations of their cross-sections. The solder 54 is divided into three of an upper portion (reference numeral: 78a), an middle portion (reference numeral: 78b), and a lower portion (reference numeral: 78c), and corresponding pseudo-transmission images are an upper pseudo transmission image 80a, a middle pseudo transmission image 80b, and a lower pseudo transmission image 80c, respectively. Because there are sometimes the cases where it can be determined that a void present in either of the upper portion 78a and the lower portion 78c is abnormal as a joint state of solder, but a void present in the middle portion 78b is normal as a joint state of solder, the solder 54 is divided into three of the upper portion 78a, the middle portion 78b, and the lower portion 78c in creating a pseudo transmission image.

A void is a bubble (air) and has a smaller absorptance of a radiation ray than that of solder. Accordingly, when a void is present in solder photographed on a pseudo transmission image in which an absorptance of a radiation ray has been imaged, a clear difference emerges between the pixel values of the region. For example, when the absorptance of a radiation ray is imaged such that a pixel value becomes lower as the absorptance of a radiation ray is larger, the pixel value of a void becomes large, and hence the void is imaged as a bright region.

Accordingly, the void inspection unit 48 tries to detect a bright region from the region of the solder that is dark and has a small pixel value, with respect to each of the upper pseudo transmission image 80a, the middle pseudo transmission image 80b, and the lower pseudo transmission image 80c. As a result, when a bright region whose area is larger than or equal to a predetermined value is detected, alternatively when bright regions whose number is larger than or equal to the predetermined number of pieces are detected, in the upper pseudo transmission image 80a or the lower pseudo transmission image 80c, the void inspection unit 48 determines that a void is present and the joint state of the solder is abnormal. In FIG. 8, a blank region (reference numeral: 82a) in the upper pseudo transmission image 80a, a blank region (reference numeral: 82b) in the middle pseudo transmission image 80b, and a blank region (reference numeral: 82c) in the lower pseudo transmission image 80c represent void regions, respectively.

Herein, the predetermined area means a reference area for the void inspection unit 48 specifying whether a void is present in solder. The predetermine number of pieces means the number of void regions for the void inspection unit 48 specifying whether a void is present in solder. The reference area and the number of void regions can be freely set by an operator through a non-illustrated input device, such as a mouse or a key board. In addition, the value that has been once set can be stored in the recording unit 34 to be set after read therefrom.

When multiple voids have been detected, the reference area may be the total area of the voids, alternatively be a maximum area of the voids. When a void has been detected in the middle pseudo transmission image 80b, it is not determined that the joint state of the solder is abnormal, but it may be displayed that a void has been detected in the middle pseudo transmission image 80b to notify an operator.

As stated above, results of the inspections performed by the bridge inspection unit 44, the fusion state inspection unit 46, and the void inspection unit 48 are stored in the recording unit 34 and are displayed on the monitor 12. An operator can confirm the joint state of the solder by checking the display on the monitor 12. Because the respective inspection results performed by the bridge inspection unit 44, the fusion state inspection unit 46, and the void inspection unit 48 have been quantified, the joint state of the solder can also be confirmed automatically by introducing threshold values or algorithms for determination based on the threshold values.

Operations of the inspection apparatus having the aforementioned configuration will be described as follows: In the production line, the cross-sectional image creation unit 36 first creates cross-sectional images of a substrate that is an object to be inspected, and the pseudo cross-sectional image creation unit 40 creates a pseudo cross-sectional image. The inspection unit 42 determines the joint state of the solder. An operator may confirm the results of the determination made by the inspection unit 42, alternatively the joint state of the solder may be determined automatically based on the results of the determination made by the inspection unit 42.

As stated above, according to the embodiment, the joint state of the solder can be simply determined from cross-sectional images of a substrate.

The present invention has been described above based on a preferred embodiment. The embodiment has been described for exemplary purpose only, and it can be readily understood by a person skilled in the art that various modifications may be made by making various combinations of the aforementioned components or processes, which are also encompassed in the scope of the present invention.

In the above description, it has been described that the bridge inspection unit 44, the fusion state inspection unit 46, and the void inspection unit 48 respectively inspect the joint state of the solder in series in this order and the inspections are sometimes not performed depending on the results of upstream inspection; however, all inspections may be performed. In this case, all objects to be inspected are inspected from different viewpoints, it is advantageous in terms of increasing the reliability of inspection. In this case, the bridge inspection unit 44, the fusion state inspection unit 46, and the void inspection unit 48 may perform inspections simultaneously and in parallel with each other.

REFERENCE NUMERALS

10 PC
34 RECORDING UNIT
36 CROSS-SECTIONAL IMAGE CREATION UNIT
38 SUBSTRATE SURFACE DETECTION UNIT
40 PSEUDO CROSS-SECTIONAL IMAGE CREATION UNIT
42 INSPECTION UNIT
44 BRIDGE INSPECTION UNIT
46 FUSION STATE INSPECTION UNIT
48 VOID INSPECTION UNIT
68 BOUNDARY DETECTION UNIT
70 DIAMETER MEASUREMENT UNIT
100 RADIATION RAY INSPECTION APPARATUS

INDUSTRIAL APPLICABILITY

The present invention can be particularly used in an inspection apparatus for inspecting an object to be inspected based on a transmission image of the object to be inspected, the transmission image being obtained by radiating a radiation ray.

The invention claimed is:

1. An inspection apparatus comprising:
a substrate surface detection unit configured to perform image analysis of cross-sectional images of an object to be inspected including a substrate and an electronic component and to specify, from the cross-sectional images, a surface image on which the surface of the substrate is photographed;
a pseudo cross-sectional image creation unit configured to specify, based on the surface image, a region of solder for joining the substrate and the electronic component, the solder being photographed on the cross-sectional images, and to create a pseudo cross-sectional image in which an imaged region is made to have a thickness through compositing the cross-sectional images on which the solder is photographed; and
an inspection unit configured to estimate whether a joint state of the solder is good or bad by performing image analysis on the region of the solder photographed on the surface image and on the region of the solder photographed on the pseudo cross-sectional image,
wherein the inspection unit includes a fusion state inspection unit configured to specify, by performing image analysis of the surface image, whether the joint between the substrate and the component is insufficient due to lack of fusion of the solder, the fusion state inspection unit including a boundary detection unit configured to inspect a fusion state of the solder by performing tomographic image analysis of the surface image to specify a region of the solder, and by checking presence or absence, respectively, of an artifact of computed tomography emerging in the boundary portion of the region when the fusion state of the solder is good in comparison with when the fusion state of the solder is bad.

2. The inspection apparatus according to claim 1, wherein the fusion state inspection unit includes a measurement unit configured to inspect a fusion state of the solder by performing image analysis of the surface image to specify a region of the solder photographed on the surface image, and by measuring whether the dimension of the region of the solder is larger than or equal to a reference dimension for determining pass or fail of a fusion state of the solder.

* * * * *